United States Patent [19]

Thong

[11] Patent Number: 4,748,348
[45] Date of Patent: May 31, 1988

[54] MULTI-LEVEL PATTERN DETECTOR FOR A SINGLE SIGNAL

[75] Inventor: Tran Thong, Beaverton, Oreg.

[73] Assignee: Tektronix, Inc., Beaverton, Oreg.

[21] Appl. No.: 947,156

[22] Filed: Dec. 29, 1986

[51] Int. Cl.[4] .......................... H03K 5/24; H03K 5/26
[52] U.S. Cl. .................................... 307/517; 307/480; 307/529; 307/360; 307/603; 328/55; 328/117
[58] Field of Search ............... 307/440, 445, 480, 517, 307/529, 350, 354, 360, 361, 590, 603, 605, 606; 328/55, 61, 63, 110, 117, 127, 130.1, 132, 135, 149, 185; 377/118

[56] References Cited

U.S. PATENT DOCUMENTS

| | | | |
|---|---|---|---|
| 4,019,145 | 4/1977 | Rathe | 307/517 X |
| 4,027,261 | 5/1977 | Laurent et al. | 307/480 X |
| 4,181,855 | 1/1980 | Horrocks | 328/110 X |
| 4,229,702 | 10/1980 | Thomas, Jr. | 328/110 |
| 4,320,525 | 3/1982 | Woodward | 307/480 X |
| 4,398,101 | 8/1983 | Friauf | 328/110 X |
| 4,398,218 | 8/1983 | Acker | 307/350 X |
| 4,403,193 | 9/1983 | Takemura | 307/514 X |
| 4,429,404 | 1/1984 | Mai | 307/350 X |
| 4,504,749 | 3/1985 | Yoshida | 307/603 X |

Primary Examiner—Stanley D. Miller
Assistant Examiner—D. R. Hudspeth
Attorney, Agent, or Firm—Allston L. Jones; Robert S. Hulse

[57] ABSTRACT

A method and apparatus are disclosed which provide for the generation of a trigger signal responsive to the detection of a plurality of selected sequential events in a single monitored signal. A plurality of trigger detect devices operate independently to monitor a signal for the occurrence of selected trigger criteria, and produce indications thereof having selected durations. The duration of the indications function to provide continuous indications of the occurrence of the selected trigger conditions over the periods thereof. In one embodiment, a state machine delays each of the indications by an amount of time approximately equal to the time between the respective events and a final event in the sequence, thereafter combining the indications according to preselected logical operations. As a result of the delays, the indications from the trigger detect devices are combined at approximately the same time. The duration of the indications operate to preclude timing differences between events from preventing detection of the series of selected sequential events. In an alternate embodiment, the state machine operates to combined information from the trigger detect devices in a serial fashion according to pre-selected logical operations and delayed by selected time periods to produce the desired trigger signal. Timing differences between sequential events are again precluded from preventing detection of the series of selected sequential events by the duration of the continuous indication produced by each of the trigger detect devices.

22 Claims, 6 Drawing Sheets

MULTI-LEVEL PATTERN DETECTOR FOR A SINGLE SIGNAL

BACKGROUND

This invention relates to the field of electronic trigger devices, and in particular to a method and apparatus for detection of a predefined time sequence of events in a single signal, and the subsequent generation of an indication therefor.

In electronic monitoring applications, it is frequently desirable to monitor a signal for the occurrence of selected events, and produce an indication in response thereto. Monitoring activity may be performed with respect to a single signal or a plurality of signals. It is to be understood that the present invention is concerned with monitoring a single signal for the occurrence of a plurality of sequential events occurring therein, and the production of an indication in response thereto.

In the past, single signals have been monitored with respect to level and slope criteria. In particular, an indication is generated responsive to the level and slope of a monitored signal becoming equal to a selected level and slope. While such an approach is useful in a wide variety of applications, e.g., a triggered sweep oscilloscope, there are many applications where a more complex monitoring capability is necessary.

Level and slope information may be combined with other information to produce more complex trigger criteria. By way of illustration, an indication generated as a result of level and slope criteria being satsfied may be used to trigger a timing device. The timing device thereafter operates to measure a selected period of time, and produce an indication subsequent to the passage of the selected time period. Delayed trigger sweep oscilloscopes are an illustration of such an application.

While the foregoing applications have addressed detection of a single event, more complex monitoring operations may involve the detection of a series of sequential events in a single signal. By way of illustration, a plurality of events in a monitored signal may be defined by specifying a level and slope for each of such events. In addition, the amount of time by which each of such events is displaced from either an adjacent event or a final event in such a sequence may be specified. Thereafter, level and slope monitoring apparatus may be employed to detect the occurrence of each of such events, and used with associated timing apparatus to produce a trigger signal at the occurrence of a final event in such a sequence. While such an arrangement is plausible, a number of practical considerations preclude effective use of such an approach. In particular, it is frequently difficult to precisely specify the amount of time between events in such a sequence. In addition, the times at which the events occur may likewise vary. Such timing inaccuracies generally preclude successful detection of a sequence of events in a single signal.

In a similar manner, it is frequently desirable to monitor a binary signal for the occurrence of a selected pattern of information. In the past this has generally been accomplished through the use of a state machine which operates to continuously monitor a signal, and change states upon the occurrence of each change in the binary signal. Again, while such an approach in theory is possible, practical considerations frequently operate to limit the effectiveness of such an approach. In particular, as the clock which is associated with the binary signal is generally not available for synchronization purposes, timing differences between the clocks associated with monitoring apparatus and the apparatus which is producing the binary signal frequently preclude reliable detection of such a pattern of information.

There is consequently a need for electronic monitoring apparatus capable of detecting a sequence of events in a single signal, notwithstanding timing differences which may occur between the sequential events therein.

SUMMARY

In accordance with the method and apparatus of the present invention, a plurality of selected serial events may be detected in a single monitored signal, notwithstanding uncertainty with respect to the precise times at which each of said events occur. A plurality of trigger detect devices each monitor for the occurrence of one of the selected events, and produce an indication of a selected period in response to the detection of the associated event. The indications so produced are thereafter combined in a state machine to produce a final trigger signal indicating the detection of the selected serial events.

In one embodiment of the present invention, the indication from each of the trigger detect devices is delayed by the state machine by an amount of time corresponding to the approximate amount of time by which the event detected by the associated trigger detect device is displaced in time from the final event in the sequence of serial events. The delayed indications from each of the trigger detect devices are thereafter combined in a selected manner to produce a final trigger signal. The periods associated with the indications produced by the trigger detect devices function to provide a continuous indication of the occurrence of the corresponding event for said periods, thereby enabling detection of the plurality of selected serial events, notwithstanding uncertainty with respect to the precise times at which each of said events occur.

In an alternate embodiment of the present invention, the indication from a first trigger detect devices is delayed by the state machine by a selected period of time corresponding to the approximate amount of time by which the selected event is displaced in time from a subsequent event in the sequence of serial events. An indication from a trigger detect device functioning to detect the subsequent event is then combined in a selected manner with the delayed indication produced by the first trigger detect device. It will be observed in this manner that the period of the signal produced by the first trigger detect device operates to provide a continuous indication of the occurrence of the first event for said period, thereby allowing detection of both the first and second events notwithstanding uncertainty with respect to the precise times at which the first and second event occur. Indications produced by additional trigger detect devices are then combined in a similar manner to provide an indication of the occurrence of the selected serial events.

DETAILED DESCRIPTION OF THE PREFERRED EMBODIMENT

Figure 1:
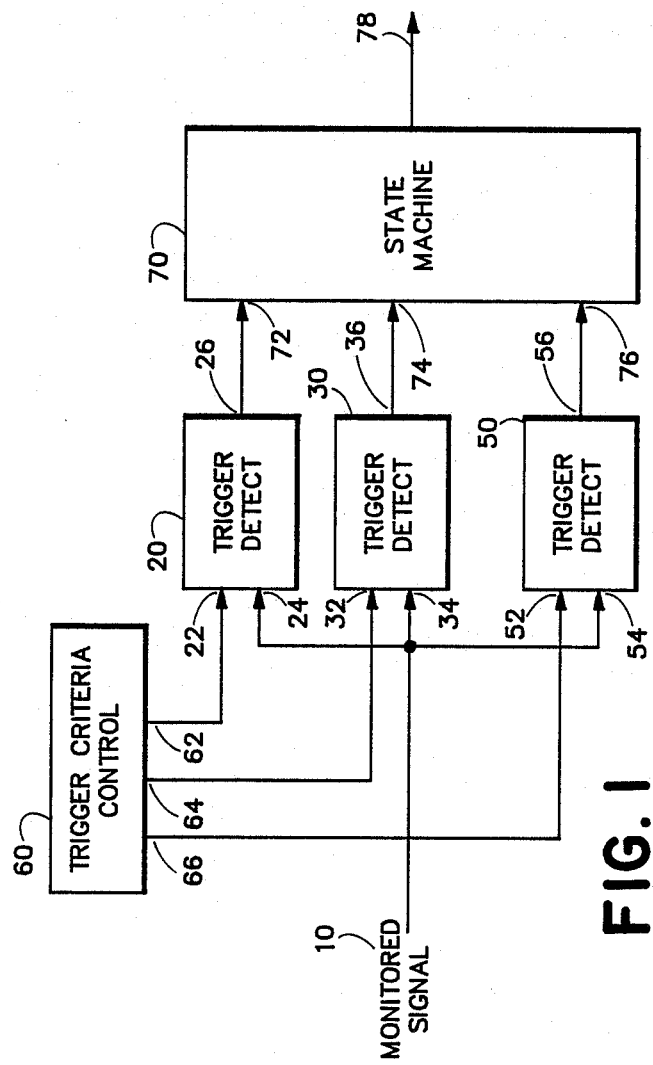
FIG. 1 is a functional block diagram of apparatus in accordance with the present invention.

A single input signal is continuously monitored for the serial occurrence of a set of pre-defined conditions, and upon the occurrence thereof, an indication is produced, as broadly illustrated by functional apparatus in FIG. 1. Referring now to FIG. 1, trigger detect 20 has associated therewith input terminals 22 and 24, and output terminal 26. Trigger detect 20 functions to monitor the signal coupled to terminal 24 to identify a portion of that signal that corresponds to the trigger criteria previously coupled to input terminal 22. Trigger criteria coupled to input terminal 22 may be any of a variety of information descriptive of a desired trigger criteria, including level and slope information, as more fully discussed hereafter. Trigger detect 20 produces a signal on its output terminal 26 having a selected period when trigger criteria coupled to input terminal 22 is found in the input signal coupled to input terminal 24.

Any number of a plurality of trigger devices similar to trigger detect 20 may be employed, e.g., trigger detect 30 and 50. Trigger detect 30 and 50 have associated therewith input terminals 32 and 52, 34 and 54, and output terminals 36 and 56, respectively. Each of trigger detect 30 and 50 functions to independently compare the same input signal coupled to their input terminals 34 and 54, respectively, with trigger criteria previously coupled to input terminals 32 and 52, respectively. Trigger criteria coupled to input terminals 32 and 52 may also be any of a variety of information descriptive of desired trigger criteria, as previously discussed with respect to trigger detect 20. Trigger detect 30 and 50 each produces a signal having a selected duration on its output terminals 36 and 56, respectively, when the selected trigger criteria are found present in the input signal.

A plurality of trigger detect devices, i.e., trigger detect 20, 30 or 50, may be present, the number of which being determined by the nature of a predefined serial sequence of events which are desired to be detected, as more fully discussed hereafter. Consequently, while FIG. 1 illustrates three trigger detect devices, i.e., trigger detect 20, 30 and 50, it is to be understood that any number of a plurality of trigger devices may be employed.

Trigger criteria control 60 has associated therewith terminals 62, 64 and 66, and functions to couple selected trigger criteria to each trigger detect device, as more fully discussed hereafter.

State machine 70 functions to monitor the signals produced by each trigger detect device, and produce a trigger signal when a predefined sequence of signals from the trigger detect devices has been found to exist. State machine 70 has a plurality of input terminals, e.g., input terminals 72, 74 and 76, and an output terminal 78. As was the case with the number of trigger detect devices, it is to be understood that the number of input terminals associated with state machine 70 is determined by the number of trigger detect devices employed in a particular application, there being one input terminal for each trigger detect device to couple the signal produced therefrom to state machine 70.

The foregoing described apparatus is configured in the following manner. A single signal which is desired to be monitored, i.e., monitored signal 10, is coupled to each of the input terminals of the trigger detect devices, e.g., terminals 24, 34 and 54, respectively. Trigger criteria from trigger criteria control 60 is coupled to each trigger detect device.

The foregoing described apparatus operates in the following manner. Trigger criteria control 60 first couples preselected trigger criteria to each of the trigger detect devices. The precise nature of the trigger criteria coupled to each of the foregoing described trigger detect devices is determined by a desired monitoring operation, as more fully discussed hereafter, and could include combinations of level and slope information. Trigger criteria control 60 further couples time period information to each trigger detect device, as more fully discussed hereafter. Thereafter, each of trigger detect devices 20, 30 and 50 operates in an independent manner to continuously compare monitored signal 10 against the trigger criteria previously coupled thereto. When the trigger criteria of interest is found present in monitored signal 10, the corresponding trigger detect device produces an indication thereof on the associated output terminal, having a duration according to the time period information previously coupled thereto. State machine 70 monitors the occurrence of signals appearing on its input terminals, and upon the occurrence of a pre-defined sequence thereon, functions to produce an indication thereof on output terminal 78, as more fully discussed hereafter. It should be observed in this regard that state machine 70 may be configured to detect any of a wide variety of conditions appearing on the input terminals associated therewith.

Figure 2:
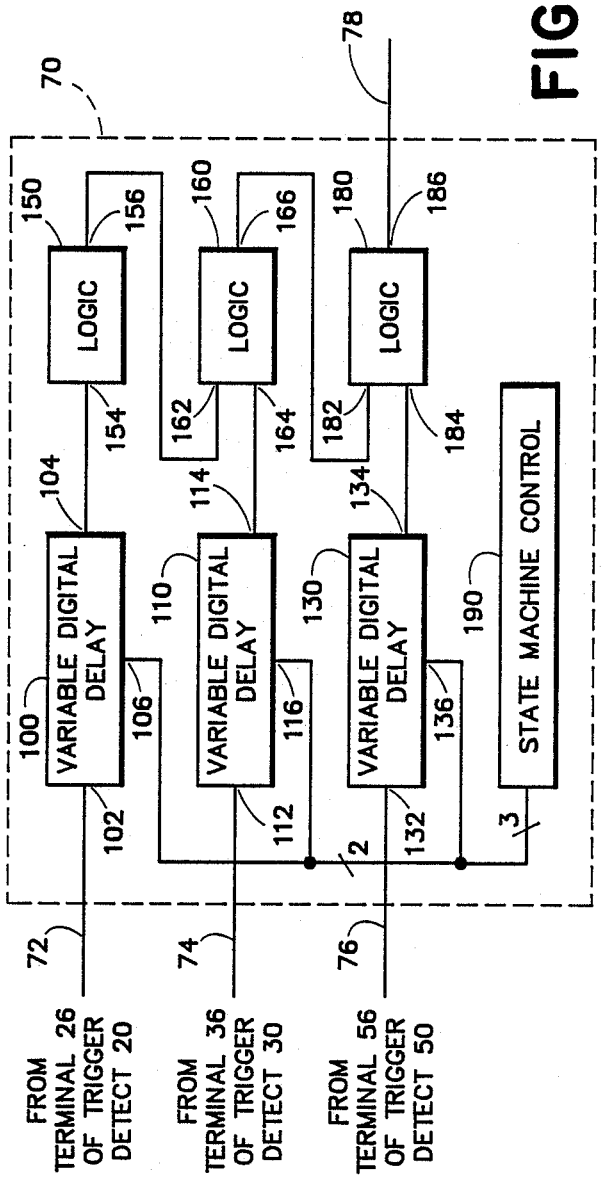
FIG. 2 is a functional block diagram of an implementation of state machine 70 of FIG. 1.

FIG. 2 illustrates a functional implementation for state machine 70 (FIG. 1). Referring to FIG. 2, variable digital delay 100 has an input terminal 102 and an output terminal 104. In addition, variable digital delay 100 further has a control terminal 106 through which control information, i.e., a clock signal, a load signal and a signal containing time period information, is coupled to variable digital delay 100, as more fully discussed hereafter. Variable digital delay 100 functions responsive to a first signal coupled to input terminal 102 to produce a second signal on output terminal 104 after a selected period of time. In particular, variable digital delay 100 functions as a delay line having a selected delay period. Consequently if a low-to-high transition occurs on a signal coupled to input terminal 102, the low-to-high transition will appear on output terminal 104 subsequent to the expiration of the selected delay period. The duration of the selected delay period is determined by information previously coupled to control terminal 106, as more fully discussed hereafter. Variable digital delays 110 and 130 likewise have input terminals 112 and 132, output terminals 114 and 134, and control terminals 116 and 136, respectively. Variable digital delays 110 and 130 function in a manner identical to variable digital delay 100. State machine 70 employs a plurality of such devices, as indicated generally by variable digital delays 100, 110 and 130. The number of variable digital delays employed in a specific implementation is determined by the number of trigger detect devices, e.g., trigger detect 20, 30 or 50 (FIG. 1), employed in a particular application.

Logic 150 has an input terminal 154 and an output terminal 156. Logic 150 functions to produce a signal on its output terminal 156 responsive to the signal coupled to its input terminal 154 according to a preselected logic operation, as more fully discussed hereafter. Logic 160 and 180 have input terminals 162, 164 and 182, 184, and output terminals 166 and 186, respectively. Logic 160 and 180 function to produce a signal on their output terminals 166 and 186, respectively, responsive to signals coupled to their input terminals 162, 164 and 182, 184, respectively, according to preselected logic operations, as more fully discussed hereafter. State machine 70 has a plurality of such logic devices. The number of logic devices employed in an application is determined by the corresponding number of variable digital delays, there being one logic device associated with each variable digital delay for the functional implementation of state machine 70 illustrated in FIG. 2.

State machine control 190 functions to produce signals necessary in the operation of the variable digital delays associated with state machine 70. In particular, state machine control 190 functions to couple preselected time periods to variable digital delays 100, 110 and 130. The time period coupled to each variable digital delay corresponds to an approximate period of time between the event detected by the associated trigger detect device and the final event of the serial sequence of events, as more fully discussed hereafter. The manner in which the foregoing described signals would be produced by state machine control 190 would be well known to one of ordinary skill in the art.

The foregoing described apparatus is configured in the following way. The output terminal of each trigger detect circuit (FIG. 1) is coupled to a different input terminal of the variable digital delay circuits of state machine 70. The output terminal 104 of the first variable digital delay is coupled to terminal 154 of logic 150. Output terminal 156 of logic 150 is coupled to input terminal 162 of logic 160. In a similar manner as was previously discussed with respect to variable digital delay 100, input terminals 112 and 132 of variable digital delays 110 and 130 are coupled to the corresponding output terminals of the associated trigger detect devices (FIG. 1). Output terminal 114 of variable digital delay 110 is coupled to input terminal 164 of logic 160. Subsequent combinations of variable digital delays and associated logic devices are configured in a similar manner. Output terminal 134 of variable digital delay 130 is coupled to input terminal 184 of logic 180. Terminal 182 of logic 180 is coupled to the output of the preceding logic device. In an implementation employing three trigger detect devices, e.g., trigger detect 20, 30 and 50 (FIG. 1), output terminal 166 of logic 160 would be coupled to terminal 182 of logic 180. The output of state machine 70, i.e., terminal 78 of FIG. 1, is obtained from the output terminal of the last logic device, e.g., terminal 186 of Logic 180.

The foregoing described apparatus of FIG. 2 operates in the following manner. Responsive to a signal having a selected duration from the associated trigger detect coupled to each of the input terminals of state machine 70, each variable digital delay produces a signal on its output terminal subsequent to the expiration of a time period as determined by the value previously loaded into each variable digital delay individually by state machine control 190. It will be understood in this regard that the time period associated with variable digital delay 100 corresponds to the approximate amount of time between the occurrence of the event detected by trigger detect 20 and a final event of the sequence of serial events, as more fully discussed hereafter. It should consequently be observed that responsive to detection of a trigger criteria in monitored signal 10 and the corresponding generation of an indication thereby of a selected duration by trigger detect 20, variable digital delay 100 functions to delay said indication by an amount of time approximately equal to the time between the occurrence of the detected event and the final event in the sequence of events. Logic 150 in response to the signal from variable digital delay 100 operates to produce a signal in accordance with the pre-selected logic operation performed thereby, as discussed more fully hereafter. In a similar manner, responsive to a signal having a selected duration from trigger detect 30 coupled to terminal 74, variable digital delay 110 produces a signal on terminal 114 subsequent to the expiration of a time period as determined by the value previously loaded into variable digital delay 110 by state machine control 190. It will be understood in this regard that the time period associated with variable digital delay 110 corresponds to the approximate amount of time between the occurrence of the event detected by trigger detect 30 and the final event of the sequence of serial events, as more fully discussed hereafter. As was the case with variable digital delay 100, it should be observed that responsive to detection of a trigger criteria in monitored signal 10 and the corresponding generation of an indication thereby of a selected duration by trigger detect 30, variable digital delay 110 functions to delay said indication by an amount of time approximately equal to the time between the occurrence of the detected event and a final event in the sequence of events. It should be particularly observed that the foregoing discussed signals produced by trigger detect 20 and 30 appear on terminals 104 and 114 of variable digital delays 100 and 110, respectively, at approximately the same time. Consequently, the signals coupled to logic 150 and 160 occur at approximately the same time. It should be understood that as each of these signals has a selected duration, timing differences between the occurrence of the events detected by trigger detect 20 and 30 will not preclude detection of both events by logic 150 and 160, provided the duration of the indications produced by the respective trigger detect devices is greater than any timing differences, as more fully discussed hereafter. Logic 160 in response to the signal from variable digital delay 110 and the signal from logic 150 operates to produce a signal in accordance with the preselected logic operation performed thereby, as discussed more fully hereafter. Further combinations of discussed more fully hereafter. Further combinations of variable digital delays and logic devices operate in a similar cascaded fashion, with the ultimate output from state machine 70 appearing on terminal 186 of logic 180.

It should be observed with respect to the functional implementation of state machine 70 illustrated in FIG. 2 that the operation of each of the variable digital delays is contingent only upon the generation of a signal by the trigger detect device coupled thereto.

Figure 3:
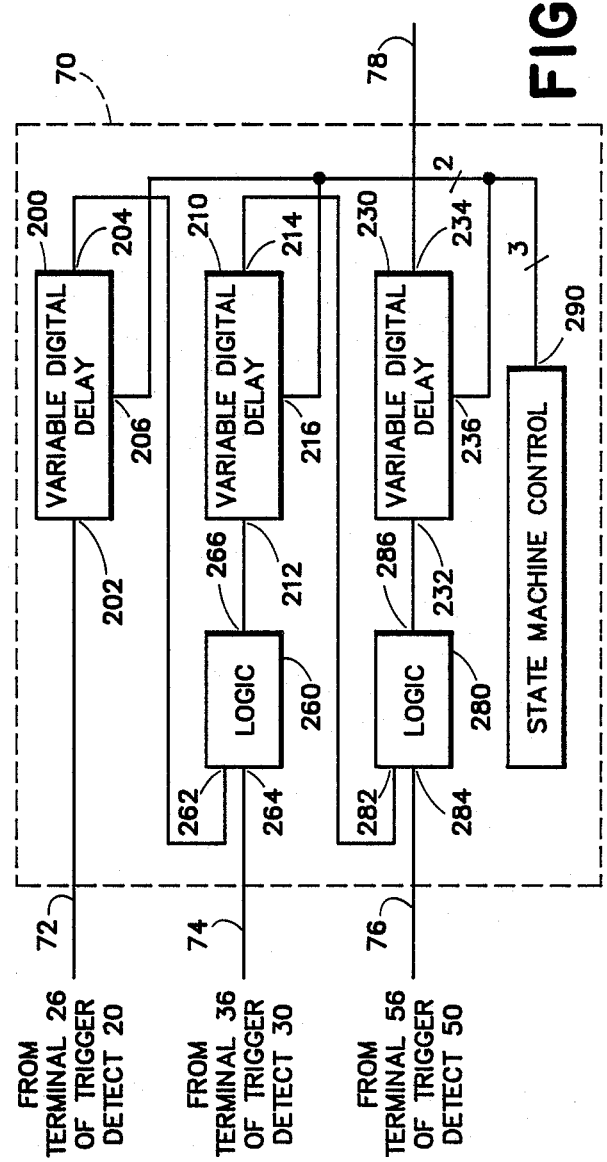
FIG. 3 is a functional block diagram of an alternate implementation of state machine 70 of FIG. 1.

FIG. 3 illustrates a functional implementation of an alternate embodiment of state machine 70. Referring now to FIG. 3, variable digital delays 200, 210 and 230 have input terminals 202, 212 and 232, output terminals 204, 214 and 234, and control terminals 206, 216 and 236, respectively. Variable digital delays 200, 210 and 230 operate in an identical fashion to variable digital delay 100 previously discussed with respect to FIG. 2.

Logic 260 and 280 have input terminals 262, 264, and 282, 284, respectively, and output terminals 266 and 286, respectively. Logic 260 and 280 function to produce a signal on output terminals 266 and 286, respectively, responsive to signals coupled to their respective input terminals according to a preselected logic operation, as more fully discussed hereafter.

State machine control 290 functions in a similar manner to state machine control 190 previously discussed with respect to FIG. 2.

The foregoing described apparatus is configured in the following way. Output terminal 26 of trigger detect 20 (FIG. 1) is coupled to terminal 202 of variable digital delay 200. Output terminal 204 of variable digital delay 200 is coupled to terminal 262 of logic 260. Output terminal 36 of trigger detect 30 (FIG. 1) is coupled to terminal 264 of logic 260. Output terminal 266 of logic 260 is coupled to terminal 212 of variable digital delay 210. As was the case previously discussed with respect to FIG. 2, the number of variable digital delay devices employed in the functional apparatus of FIG. 3 is determined by the number of trigger detect devices employed in a particular application; there being an equal number of variable digital delay devices and trigger detect devices. The output signal from a subsequent trigger detect device is coupled to the functional apparatus of FIG. 3 in a similar manner as was discussed with respect to trigger detect device 30, logic 260 and variable digital delay 210, i.e., the output from a trigger detect device is coupled to one input of the associated logic device, the second input of the logic device being obtained from the output of the preceding variable digital delay, and the output of the logic device being coupled to the input terminal of the associated variable digital delay. In an application employing three trigger detect devices, e.g., trigger detect 20, 30 and 50 (FIG. 1), output terminal 214 of variable digital delay 210 would be coupled to terminal 282 of logic 280. Output terminal 56 from trigger detect device 50 is coupled to terminal 284 of logic 280, and output terminal 286 of logic 280 is coupled to terminal 232 of variable digital delay 230. The output of state machine 70 is obtained from terminal 234 of variable digital delay 230.

The foregoing described apparatus of FIG. 3 operates in the following manner. Responsive to a signal having a selected duration from trigger detect 20 being coupled to terminal 202 thereof, variable digital delay 200 operates to produce said signal on terminal 204 thereof subsequent to the expiration of a time period as determined by the value previously loaded into variable digital delay 200 by state machine control 290. It will be understood in this regard that the time period associated with variable digital delay 200 corresponds to the approximate amount of time between the event detected by trigger detect 20 and the event to be detected by trigger detect 30, as will be more fully discussed hereinafter. It should be observed that responsive to the detection of a trigger criteria in monitored signal 10 and the corresponding generation of an indication thereof of a selected duration by trigger detect 20, variable digital delay 200 functions to delay said indication by an amount of time approximately equal to the time between the event detected by trigger detect 20 and the following event, i.e., the event to be detected by trigger detect 30. It is consequently observed that the indications from trigger detect 20 and 30 will appear on terminals 262 and 264 of logic 260 at approximately the same time. It should be further observed that as the indications produced by trigger detect 20 and 30 are of selected durations, timing differences between the respective events detected by trigger detect 20 and 30 will not preclude their simultaneous detection by logic 260, provided the duration of the indications produced by the respective trigger detect devices is greater than any timing differences, as more fully discussed hereafter. Logic 260 operates to combine the signal produced by variable digital delay 200 with a signal produced by trigger detect 30 according to a predetermined logic operation, coupling the signal produced in accordance therewith to terminal 212 of variable digital delay 210. It will be understood in this regard that the time period associated with variable digital delay 210 corresponds to the approximate amount of time between the event detected by trigger detect 30 and the event to be detected by trigger detect 50, as will be more fully discussed hereafter. The remaining apparatus operates in a similar manner.

It should be observed with respect to the functional implementation of state machine 70 illustrated in FIG. 3, that the operation of each variable digital delay, except for the first one, is contigent not only upon the generation of a signal by the trigger detect device associated therewith, but also the occurrence of a signal from a previous variable digital delay. The delay periods determined by the variable digital delay devices of FIG. 2 are absolute, i.e., the time periods are measured in a reverse sense from a final event, whereas those determined by the variable digital delay devices of FIG. 3 are relative, i.e., the time periods are measured between sequential events. The functional implementation of state machine 70 by the apparatus of FIG. 2 is consequently of a more general nature than the apparatus of FIG. 3.

Figure 4:
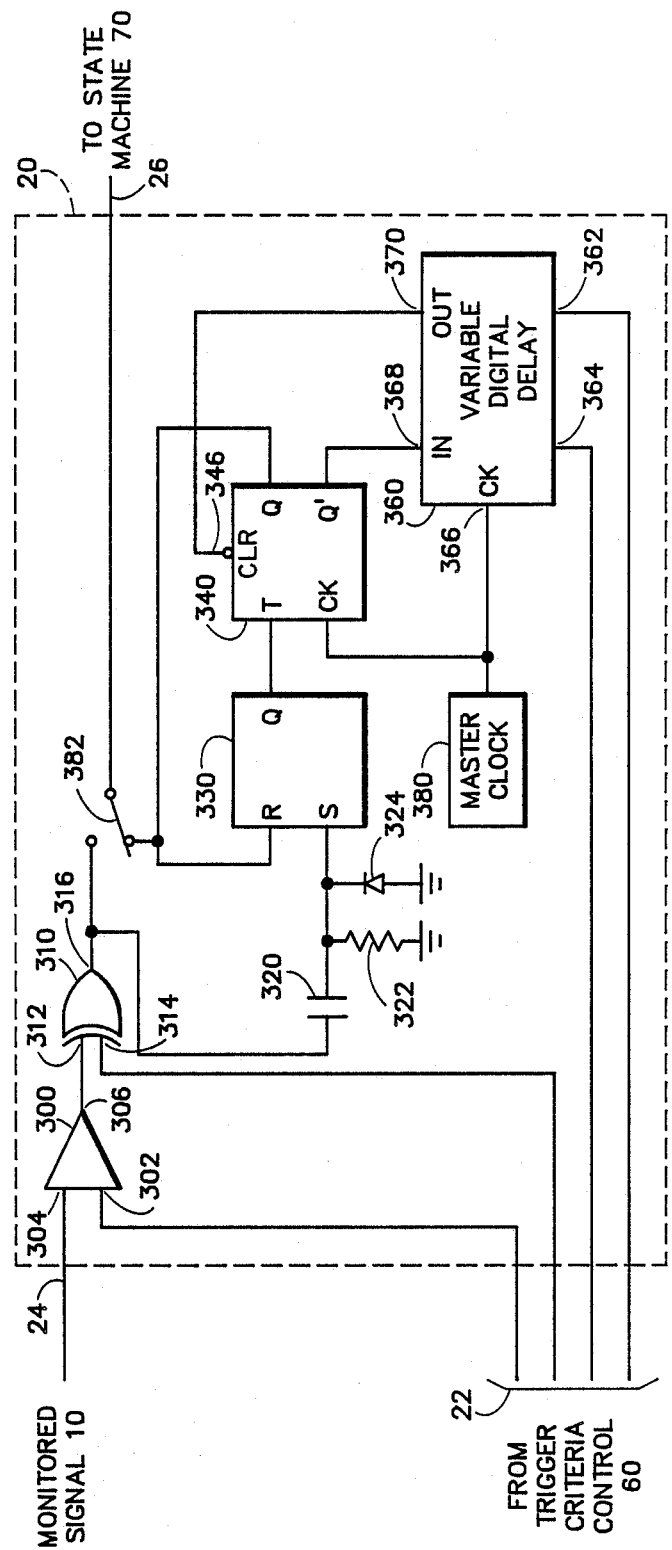
FIG. 4 illustrates an implementation for trigger detect 20 of FIG. 1.

While trigger detect 20, 30 or 50 may each be implemented in any of a wide variety of ways, FIG. 4 illustrates apparatus for one possible implementation of trigger detect apparatus. Referring now to FIG. 4, trigger criteria control 60 (FIG. 1) operates to couple a pre-selected numeric value corresponding to the selected period previously discussed with respect to trigger detect 20, 30 and 50, to variable digital delay 360 by placing a signal representative thereof on terminal 362, and a corresponding load command signal on terminal 364. Variable digital delay 360 of FIG. 4 operates in an identical manner as variable digital delay 100 previously discussed with respect to FIG. 2. A signal having a level representative of a desired trigger level is coupled from trigger criteria control 60 to terminal 302 of comparator 300 which functions to continuously compare that signal level to the signal level of the signal coupled to terminal 304, i.e., monitored signal 10, with the signal having a level representative of the desired trigger level. When the level of monitored signal 10 exceeds the desired trigger level, comparator 300 functions to produce an indication thereof on output terminal 306. For a positive slope setting, the signal on input terminal 314 is a logic zero (low), thus the signal on output terminal 316 is the same as the signal on input terminal 312. For a negative slope setting, the signal coupled to input terminal 314 is a logic one (high), resulting in the signal from terminal 316 being the inverse (complement) of the signal coupled to terminal 312. Capacitor 320 and resistor 322 comprise a differentiation circuit. When a low-to-high transition occurs on the signal from terminal 316, a positive pulse is produced. When a high-to-low transition occurs on the signal from terminal 316, diode 324 will short it to ground. Thus the S-input terminal of R-S flip-flop 330 will see a positive pulse only when monitored signal 10 crosses a selected threshold in the desired direction (slope). The pulse coupled to the S-input terminal of R-S flip-flop 330 will operate to produce a logic one state on the Q-output terminal thereof. On the occurrence of the next pulse from master clock 380, the logic one state coupled from the Q-terminal of R-S flip-flop 330 operates to place a logic one on the Q-output terminal, and a logic zero state on the Q' output terminal of T flip-flop 340. The logic one on the Q-terminal of T flip-flop 340 when coupled to the R-terminal of R-S flip-flop 330 operates to place R-S flip-flop 330 in a reset state. The logic zero state produced thereby on the Q' output terminal of T flip-flop 340 is coupled to terminal 368 of variable digital delay 360, and will appear on terminal 370 thereof subsequent to the selected time period previously coupled to variable digital delay 360. Upon the occurrence of the logic zero on terminal 370, and the subsequent coupling thereof to terminal 346, T flip-flop 340 will be placed in a clear or reset state. It is consequently observed that the signal produced on the Q terminal of T flip-flop 340 is a pulse having a duration determined by the time period previously coupled to variable digital delay 360. Switch 382 provides for the selection of the output signal of the apparatus of FIG. 4 to originate from either terminal 316 or from the Q terminal of T flip-flop 340, as more fully discussed hereafter.

From the foregoing it is observed that the apparatus of FIG. 4 operates to produce an output signal on terminal 316 of exclusive-OR gate 310 responsive to monitored signal 10 becoming equal to a level corresponding to the level coupled to terminal 302 of comparator 300, with a slope corresponding to slope information coupled to terminal 314 of exclusive-OR gate 310. In addition, a second output signal produced on the Q-output terminal of T flip-flop 340 has a duration determined by the number previously loaded into variable digital delay 360.

It is consequently observed that the apparatus of FIG. 4 produces two indications responsive to monitored signal 10 satisfying selected level and slope criteria, i.e., the signal produced on terminal 316 of exclusive-OR gate 310, and the signal produced on the Q terminal of T flip-flop 340. It will be observed that the signal produced on terminal 316 occurs when the level of monitored signal 10 exceeds the preselected level, and remains as long as the level of monitored signal 10 is greater than the selected level. However, the signal produced on the Q terminal of flip-flop 340 has a selected duration corresponding to information previously coupled to variable digital delay 360. The duration of the signal so produced is particularly significant, as it provides a continuous indication of the occurrence of the satisfaction of the associated trigger condition over the period thereof, functioning in state machine 70, subsequent to an associated delay, to preclude timing differences between selected events from preventing detection of a sequence of events.

While the variable digital delay devices previously discussed with respect to FIGS. 2, 3 and 4 may be implemented by delay devices, e.g., delay lines, as above discussed, counters may also be employed, as would be apparent to one of ordinary skill in the art.

While the foregoing has illustrated apparatus for implementation of a trigger detect device, it is to be understood that such discussion was for illustrative purposes, and is not to be interpreted as limiting the invention herein to the trigger detect apparatus or trigger criteria discussed with respect to FIG. 4. Many other types of trigger detect devices may be used in a similar manner, and would be apparent to one of ordinary skill in the art.

Figure 5:
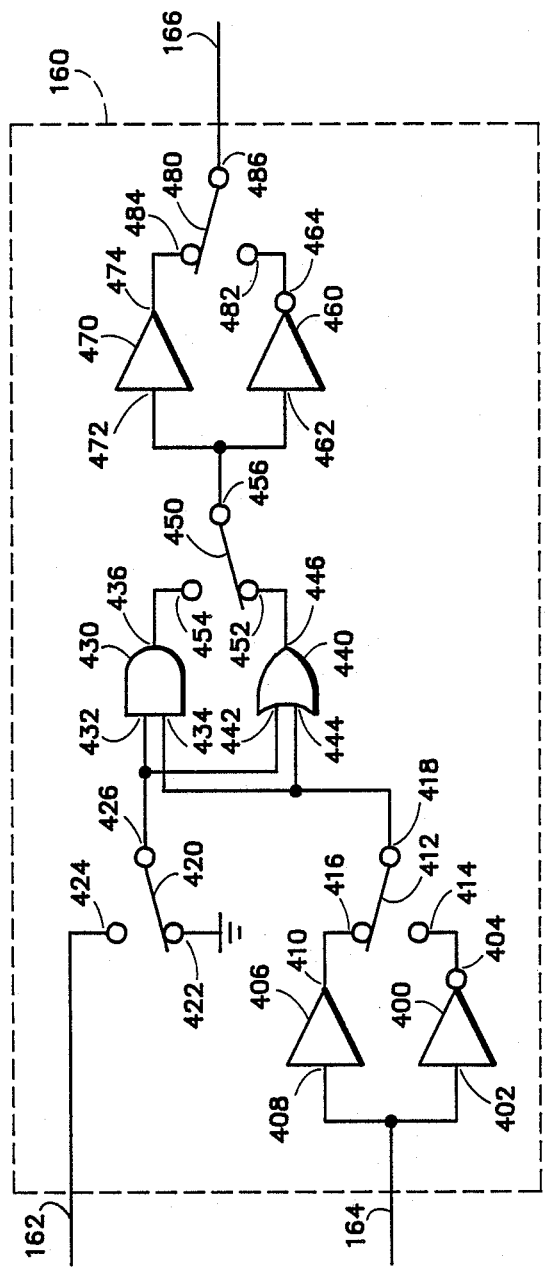
FIG. 5 illustrates an implementation of logic 150, 160 and 180 of FIG. 2, and logic 260 and 280 of FIG. 3.

FIG. 5 illustrates a preferred embodiment for the logic devices of FIGS. 2 and 3, e.g., logic 150, 160, 180, 260 and 280. It is to be understood, however, that such logic devices may be implemented in a wide variety of ways in accordance with preselected logic operations. Consequently, the apparatus of FIG. 5 is not to be interpreted as limiting the present invention thereto. Referring to FIG. 5, it is understood that terminal 424 of switch 420 corresponds to terminals 162 and 182 of logic 160 and 180, respectively (FIG. 2), and to terminals 262 and 282 of logic 260 and 280, respectively (FIG. 3). In a similar manner, terminals 402 and 408 of inverter 400 and buffer 406, respectively, collectively correspond to terminals 154, 164 and 184 of logic 150, 160 and 180 (FIG. 2), and to terminals 264 and 284 of logic 260 and 280, respectively (FIG. 3). Terminal 486 of switch 480 corresponds to terminal 156, 166 and 186 of logic 150, 160 and 180, respectively (FIG. 2), and to terminal 266 and 286 of logic 260 and 280 (FIG. 3). Switches 412, 420, 450 and 480 provide flexibility in configuring the apparatus of FIG. 5 to perform selected logic operations. In particular, with switch 420 configured in a manner to couple terminal 426 to terminal 422 thereof, switch 450 would typically be configured in a manner to couple terminal 456 to terminal 452 thereof. Switches 412 and 480 may be configured so the apparatus of FIG. 5 provides a logical inversion operation with respect to the signal coupled to terminals 402 and 408 of inverter 400 and buffer 406, respectively. If, however, switch 420 is configured in a manner to couple terminal 426 to terminal 424 thereof, switch 450 may be configured to select either the logical AND or logical OR operation of a signal coupled to terminal 424 of switch 420, and either the inverted or non-inverted signal coupled to input terminals 402 and 408 of inverter 400 and buffer 406, according to a selection made by the configuration of switch 412. An inverted or non-inverted signal corresponding to the signal resulting from the selected configuration of switch 450 may be selected by switch 480. The functions performed by switches 412, 420, 450 and 480 may be implemented by either manual switches or electronically configurable switches, as would be apparent to one of ordinary skill in the art.

Figure 6:
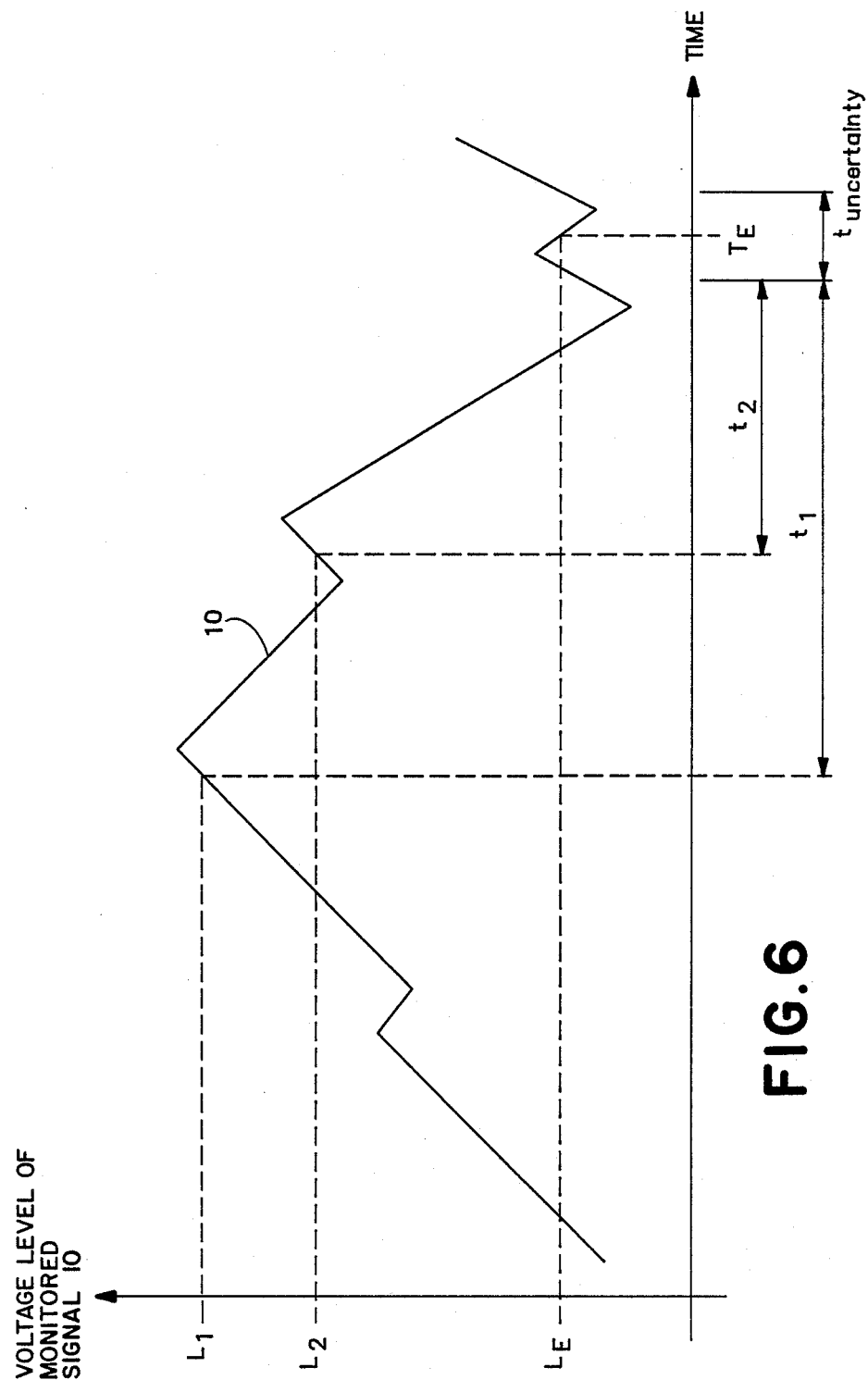
FIG. 6 is a waveform diagram illustrating operational features of the present invention.

We will now describe the operation of the apparatus of the present invention in detecting the occurrence of a series of selected serial events in a single signal, e.g., a selected condition which is preceded by two preselected conditions, as broadly illustrated in FIG. 6. FIG. 6 illustrates a voltage waveform of monitored signal 10 (FIG. 1), having a sequence of selected serial events which are desired to be detected. The final event in the sequence of events has a voltage level of $L_E$ with a negative slope at a time of $T_E$. The final event is preceded in time by two prior events: a first event wherein the monitored signal 10 has a voltage level of $L_1$ with a positive slope occurring by an approximate amount of time $t_1$ prior to the final desired event; a second event wherein monitored signal 10 has a voltage level of $L_2$ with a positive slope occurring by an approximate amount of time $t_2$ prior to the final event. Three trigger detect devices will be employed. Each trigger detect device may be implemented by the apparatus previously discussed with respect to FIG. 4. Switch 382 is configured to select the signal from the Q terminal of T flip-flop 340 as an output signal for the apparatus of FIG. 2 for trigger detect device 20 and 30. Switch 382 is configured to select the signal from terminal 316 as an output signal for the implementation of trigger detect device 50. In addition, state machine 70 may be implemented according to the functional apparatus previously discussed with respect to FIG. 2. In particular, state machine 70 may be comprised of variable digital delay 100, 110 and 130, with logic 150, 160 and 180 (FIG. 2).

For this discussion, switches 412, 420, 450 and 480 (FIG. 5) for the apparatus of logic 150 are configured as follows: switch 412 is configured with terminal 418 coupled to terminal 416, thereby connecting the output of buffer 406 to terminals 434 and 444 of AND gate 430 and OR gate 440, respectively; switch 420 is configured with terminal 426 coupled to terminal 422, thereby coupling ground potential, i.e., a logic zero, to terminal 432 and 442 of AND gate 430 and OR gate 440, respectively; switch 450 is configured with terminal 456 coupled to terminal 452, thereby connecting the output of OR gate 440 to terminal 472 of buffer 470 and terminal 462 of inverter 460; and switch 480 is configured with terminal 486 coupled to terminal 484 thereof.

Switches 412, 420, 450 and 480 assume a different configuration for the apparatus of logic 160 and 180, and are configured as follows: switch 412 is configured with terminal 418 coupled to terminal 416, thereby connecting the output of buffer 406 to terminals 434 and 444 of AND gate 430 and OR gate 440, respectively; switch 420 is configured with terminal 426 coupled terminal 424, thereby coupling the first input signal to terminals 432 and 442 of AND gate 430 and OR gate 440, respectively; switch 450 is configured with terminal 456 coupled to terminal 454, thereby connecting the output of AND gate 430 to terminals 472 to buffer 470 and terminal 462 of inverter 460; and switch 480 is configured with terminal 486 coupled to terminal 484.

Referring first to FIG. 1, trigger criteria control 60 first couples trigger information to terminals 22, 32 and 52, respectively of trigger detect 20, 30 and 50. Referring to FIG. 4, trigger criteria control 60 will couple information representative of Level $L_1$ to terminal 302 of comparator 300, a signal indicating detection of a positive slope to terminal 314, a signal corresponding to time period $t_{uncertainty}$ to terminal 362 of variable digital delay 360 and a corresponding load signal to terminal 364 of said delay of the apparatus which implements trigger detect 20. Trigger criteria control 60 will also couple information representative of level $L_2$ to terminal 302 of comparator 300, a signal indicating detection of a positive slope at terminal 314, a signal corresponding to time period $t_{uncertainty}$ to terminal 362 of variable digital delay 360 and a corresponding load signal to terminal 364 of said delay of the apparatus which implements trigger detect 30. Trigger criteria control 60 will also couple information representative of level $L_E$ to terminal 302 of comparator 300, a signal corresponding to a time period of $t_{uncertainty}$ to terminal 362 of variable digital delay 360 and a corresponding load signal to terminal 364 of said delay of the apparatus which implements trigger detect 50. Referring to FIG. 2, state machine control 190 will couple a signal representative of time period $t_1$ to terminal 106 of variable digital delay 100. In a similar fashion, state machine control 190 will couple a signal representative of time period $t_2$ to terminal 116 of variable digital delay 110, and a time period of zero to terminal 136 of variable digital delay 130.

Thereafter, when the level of a monitored signal 10 equals level $L_1$ with a positive slope, trigger detect 20 (FIG. 1) will produce a signal indicating same on terminal 26 having a selected period, i.e., a period of $t_{uncertainty}$. In particular, the Q-output terminal of T flip-flop 340 (FIG. 4) will assume a logic one state for a time period of $t_{uncertainty}$. The signal so produced by trigger detect 20 in turn operates to generate at the output of variable digital delay 100 (FIG. 2) after a time period of $t_1$, a pulse of duration $t_{uncertainty}$. The output of variable digital delay 100 is thereafter coupled through logic 150, i.e., through buffer 406, OR-Gate 440 and buffer 470, and appears at output terminal 156 of logic 150. In a similar fashion, when the level of monitored signal 10 equals level $L_2$ with a positive slope, trigger detect 30 (FIG. 1) will produce a signal indicating same on terminal 36 having a selected period, i.e., a period of $t_{uncertainty}$. In particular, the Q-output terminal of T flip-flop 340 (FIG. 4) will assume a logic one state for a time period of $t_{uncertainty}$. The signal so produced by trigger detect 30 is in turn coupled to variable digital delay 110 (FIG. 2), and appears at terminal 114 thereof subsequent to a period of $t_2$. The output of variable digital delay 110 is thereafter coupled to logic 160. In particular, the output of variable digital delay 110 is coupled through buffer 406 to terminal 434 of AND gate 430. As the output from logic 150 appears at terminal 432 of AND gate 430, the output from terminal 436 of AND gate 430 is at a logic one, and is coupled through buffer 470 to terminal 474 thereof, i.e., to terminal 166 of logic 160. When the level of monitored signal 10 equals level $L_E$ with a negative slope, trigger detect 50 will produce a signal indicating same on terminal 56 (FIG. 1) having a selected period, i.e. a period of $t_{uncertainty}$. In particular, the Q-output terminal of T flip-flop 340 (FIG. 4) will assume a logic one state for a time period of $t_{uncertainty}$. The signal so produced by trigger detect 50 in turn is delayed by a time period of zero by variable digital delay 130 (FIG. 2). The output of variable digital delay 130 is thereafter coupled to logic 180. In particular, the output of variable digital delay 130 is coupled through buffer 406 (FIG. 5) to terminal 434 of AND gate 430. As the output from logic 160 appears at terminal 432 of AND gate 430, the output from terminal 436 of AND gate 430 is at a logic one, and is coupled through buffer 470 to terminal 474 thereof, i.e., to terminal 78 of state machine 70, thereby producing the trigger signal for state machine 70.

It should be particularly observed with respect to the foregoing discussion, that as a result of the delay interposed by the operation of variable digital delay 180 and 110, the indication produced by the trigger detect devices are coupled to the associated logic devices, i.e., logic 150, 160 and 180 at approximately the same time. In addition, as each of the indications produced by the respective trigger detect devices has a period of $t_{uncertainty}$, timing differences between the respective events will not preclude detection of the serial sequence of events, provided the time at which each of said events occurs does not vary from its expected time by more than $t_{uncertainty}/2$.

While the foregoing discussion has assumed that an identical time period of $t_{uncertainty}$ is coupled to each of the variable digital delays 360 of trigger detect devices 20, 30 and 50, it should be understood that differing time periods could likewise have been employed, the duration of the selected time periods serving as tolerance periods during the time period in which the desired final trigger event may occur.

While the foregoing has described the operation of the functional apparatus of FIG. 1 with state machine 70 implemented according to the functional apparatus of FIG. 2, it is to be understood that state machine 70 could likewise be implemented according to the functional apparatus previously discussed with respect to FIG. 3. It will be understood in this regard that the time periods coupled to variable digital delays 200, 210 and 230 of FIG. 3 would correspond to the approximate time periods occurring between sequential events in the series of events which are desired to be detected, as previously discussed. The foregoing described apparatus of FIG. 1 would then operate in a similar manner as previously discussed.

It will be apparent to one of ordinary skill in the art that many modifications or alterations may be made to the method and apparatus described herein. All of such variations are to be considered to be within the scope of the inventive concept herein, and are limited only by the scope of the following claims.

What is claimed is:

1. Apparatus for detecting the occurrence of a plurality of selected sequential events in a single monitored signal, and producing a trigger signal responsive to the occurrence thereof, comprising:
    trigger criteria means for defining a plurality of selected events in the monitored signal;
    a plurality of event detection means, each coupled to said trigger criteria means and to receive the monitored signal, for producing an indication for a selected period of time thereafter in response to detection of a selected event in the monitored signal; and
    trigger generation means, coupled to the plurality of event detection means, for delaying each of the indications by selected differing periods, and serially combining the first through the last of the delayed indications to produce the trigger signal.

2. Apparatus as in claim 1, wherein the means for delaying the indications by selected differing periods in said trigger generation means is delay lines.

3. Apparatus as in claim 1, wherein the means for delaying the indications by selected differing periods in said trigger generation means is digital counters.

4. Apparatus as in claim 1, wherein each of said plurality of event detection means comprises means for producing an indication for a selected period of time thereafter responsive to the level and slope of the monitored signal becoming equal to a selected level and slope.

5. Apparatus as in claim 4, wherein said means for producing an indication for a selected period of time is a delay line.

6. Apparatus as in claim 4, wherein said means for producing an indication for a selected period of time is a digital counter.

7. Apparatus as in claim 1, wherein said trigger generation means further comprises means for producing an indication responsive to the selective combining of indications from said event detection means according to selective logical AND and OR operations.

8. Apparatus as in claim 7 further comprising means for selectively performing a logical inversion operation on an indication from an event detection means.

9. Apparatus as in claim 7 further comprising means for selectively performing a logical inversion operation on the indication produced by said trigger generation means.

10. Apparatus for detecting the occurence of a plurality of selected sequential events in a single monitored signal, and producing a trigger signal responsive to the occurrence thereof, comprising:
    trigger criteria means for defining a plurality of selected levels and slopes in the monitored signal;
    a plurality of event detection means, each coupled to said trigger criteria means and to receive the monitored signal, for producing an indication for a selected period of time thereafter in response to a level and slope of the monitored signal becoming equal to a selected level and slope;
    trigger generation means, coupled to the plurality of event detection means, for delaying each indication by selected differing periods, and combining the delayed indications according to a preselected combination of logical AND, OR and INVERT operations to produce the trigger signal.

11. Apparatus for detecting the occurrence of a plurality of selected sequential events in a single monitored signal, and producing a trigger signal responsive to the occurrence thereof, comprising:
    trigger criteria means for defining a plurality of selected levels and slopes in the monitored signal;
    a plurality of event detection means, each coupled to said trigger criteria means and to receive the monitored signal, for producing indications for selected differing periods of time thereafter in response to a level and slope of the monitored signal becoming equal to a selected level and slope;
    trigger generation means, coupled to the plurality of event detection means, for delaying each indication by selected differing periods, and combining the delayed indications according to a preselected combination of logical AND, OR and INVERT operations to produce the trigger signal.

12. A method for detecting a plurality of selected sequential events in a single monitored signal, and producing a trigger signal responsive to the occurrence thereof, comprising the steps of:
    defining a plurality of selected events in the monitored signal;
    monitoring the monitored signal for each of the plurality of selected events, and producing an indication for a selected period of time thereafter responsive to the occurrence of each of the selected events; and
    producing the trigger signal responsive to the indications produced by the occurrence of the selected events, each delayed by selected differing periods of time, and the first through the last subsequently serially combined.

13. Apparatus for detecting a plurality of selected events in a single monitored signal, and producing a trigger signal responsive to the occurrence thereof, comprising:
    trigger criteria means for defining a plurality of selected events in the monitored signal;

a plurality of event detection means, each coupled to said trigger criteria means and to receive the monitored signal, for producing an indication for a selected period of time thereafter in response to detection of a selected event in the monitored signal;

trigger generation means, coupled to the plurality of event detection means, for delaying a first indication by a selected amount and thereafter combining and delaying in a serial fashion indications to produce the trigger signal.

14. Apparatus as in claim 13, wherein each of said plurality of event detection means comprises means for producing an indication for a selected period of time responsive to a level and slope of the monitored signal becoming equal to a selected level and slope.

15. A method for detecting a plurality of selected events in a single monitored signal, and producing a trigger signal responsive to the occurrence thereof, comprising the steps of:

defining a plurality of selected events in a monitored signal;

detecting the occurrence of the selected events in the monitored signal, and producing indications in response thereto for selected periods of time;

delaying a first indication for selected period of time and thereafter combining and delaying in a serial fashion indications to produce the trigger signal.

16. Apparatus for detecting the occurrence of a plurality of selected sequential events in a single monitored signal, and producing a trigger signal responsive to the occurrence thereof. comprising;

trigger criteria means for defining a plurality of selected events in the monitored signal;

a plurality of event detection means, each coupled to said trigger criteria means and to receive the monitored signal, for producing an indication for a selected period of time thereafter in response to detection of a selected event in the monitored signal;

trigger generation means, coupled to the plurality of event detection means, for delaying the indications by selected differing periods, and combining the delayed indications according to a preselected combination of logical AND, OR and INVERT operations to produce the trigger signal.

17. Apparatus as in claim 16, wherein the means for delaying the indications by selected differing periods in said trigger generation means is delay lines.

18. Apparatus as in claim 16, wherein the means for delaying the indications by selected differing periods in said trigger generation means is digital counters.

19. Apparatus as in claim 16, wherein each of said plurality of event detection means comprises means for producing an indication for a selected period of time thereafter responsive to the level and slope of the monitored signal becoming equal to a selected level and slope.

20. Apparatus as in claim 19, wherein said means for producing an indication for a selected period of time is a delay line.

21. Apparatus as in claim 19, wherein said means for producing an indication for a selected period of time is a digital counter.

22. Apparatus as in claim 16 further comprising means for selectively performing a logical inversion operation on an indication from an event detection means.

* * * * *